United States Patent
Shivaray et al.

(10) Patent No.: US 10,067,189 B1
(45) Date of Patent: Sep. 4, 2018

(54) INPUT/OUTPUT PATH TESTING AND CHARACTERIZATION USING SCAN CHAINS

(71) Applicant: Xilinx, Inc., San Jose, CA (US)

(72) Inventors: Banadappa V. Shivaray, Yadgiri (IN); Ahmad R. Ansari, San Jose, CA (US); Sanjeeva R. Duggampudi, Hyderabad (IN); Pramod Surathkal, Hyderabad (IN); Ushasri Merugu, Puppalguda (IN); Bommana S. Rao, Hyderabad (IN); Sowmya Sheela Thati, Hyderabad (IN); Shashidhar S. Krishnamurthy, Hyderabad (IN)

(73) Assignee: XILINX, INC., San Jose, CA (US)

( * ) Notice: Subject to any disclaimer, the term of this patent is extended or adjusted under 35 U.S.C. 154(b) by 10 days.

(21) Appl. No.: 15/464,217

(22) Filed: Mar. 20, 2017

(51) Int. Cl.
    *G01R 31/3185* (2006.01)
    *G01R 31/3177* (2006.01)
    *G01R 31/317* (2006.01)

(52) U.S. Cl.
    CPC . *G01R 31/318594* (2013.01); *G01R 31/3177* (2013.01); *G01R 31/31723* (2013.01); *G01R 31/31727* (2013.01); *G01R 31/318572* (2013.01)

(58) Field of Classification Search
    CPC .... G01R 31/318572; G01R 31/318594; G01R 1/318536
    See application file for complete search history.

(56) References Cited

U.S. PATENT DOCUMENTS

| | | | | |
|---|---|---|---|---|
| 5,457,381 | A * | 10/1995 | Farwell | G01R 31/31715 324/750.3 |
| 6,286,119 | B1 * | 9/2001 | Wu | G01R 31/31858 712/227 |
| 6,857,092 | B1 | 2/2005 | Fox | |
| 6,874,107 | B2 | 3/2005 | Lesea | |
| 6,876,218 | B1 | 4/2005 | Simmons et al. | |
| 6,891,395 | B2 | 5/2005 | Wells et al. | |
| 6,944,836 | B1 | 9/2005 | Lai | |
| 7,080,300 | B1 | 7/2006 | Herron et al. | |
| 7,102,555 | B2 | 9/2006 | Collins et al. | |
| 7,117,416 | B1 | 10/2006 | Fox | |
| 7,188,283 | B1 | 3/2007 | Shafer et al. | |
| 7,269,805 | B1 | 9/2007 | Ansari et al. | |
| 7,302,625 | B1 | 11/2007 | Payakapan et al. | |

(Continued)

*Primary Examiner* — Steve Nguyen
(74) *Attorney, Agent, or Firm* — LeRoy D. Maunu

(57) ABSTRACT

Disclosed circuitry includes input-output pads, receive flip-flops, and transmit flip-flops coupled to the input-output pads. Data path control circuitry is coupled to data path control flip-flops, the receive flip-flops and the transmit flip-flops. The data path control circuitry is configured to selectably couple the receive flip-flops and the transmit flip-flops to the input-output pads in response to states of the data path control flip-flops. Clock control circuitry is coupled to clock control flip-flops, the receive flip-flops and the transmit flip-flops. The clock control circuitry is configured to selectably apply one of multiple clock signals to the receive flip-flops and the transmit flip-flops in response to states of the clock control flip-flops. A first scan chain is coupled to the clock control flip-flops and the data path control flip-flops. A second scan chain is coupled to the receive flip-flops and the transmit flip-flops.

20 Claims, 6 Drawing Sheets

(56) References Cited

U.S. PATENT DOCUMENTS

| | | |
|---|---|---|
| 7,305,599 B1 | 12/2007 | Duce et al. |
| 7,406,670 B1 | 7/2008 | Ansari et al. |
| 7,409,610 B1 | 8/2008 | Drimer |
| 7,424,655 B1 | 9/2008 | Trimberger et al. |
| 7,454,675 B1 | 11/2008 | Wells et al. |
| 7,493,543 B1 | 2/2009 | Wu et al. |
| 7,546,499 B1 | 6/2009 | Shafer et al. |
| 7,590,902 B1 * | 9/2009 | Tabatabaei ..... G01R 31/318508 714/724 |
| 7,603,599 B1 | 10/2009 | Cossoul et al. |
| 7,620,863 B1 | 11/2009 | Trimberger |
| 7,626,874 B1 | 12/2009 | Fan et al. |
| 7,725,787 B1 | 5/2010 | Wells et al. |
| 7,761,755 B1 | 7/2010 | Payakapan et al. |
| 7,917,820 B1 | 3/2011 | Pavle et al. |
| 9,411,701 B2 | 8/2016 | Azad |
| 2007/0011542 A1 * | 1/2007 | Mukherjee ..... G01R 31/318541 714/738 |
| 2008/0086665 A1 * | 4/2008 | Takei ............... G01R 31/31716 714/727 |
| 2009/0083595 A1 * | 3/2009 | Kanba ............ G01B 31/318536 714/729 |
| 2014/0189457 A1 * | 7/2014 | Mak ................... G01R 31/3016 714/745 |

\* cited by examiner

INPUT/OUTPUT PATH TESTING AND CHARACTERIZATION USING SCAN CHAINS

TECHNICAL FIELD

The disclosure generally relates to circuitry for characterizing delays on input/output paths of an integrated circuit.

BACKGROUND

Integrated circuit (IC) manufacturers test the input/output (I/O) paths of IC chips and packages in order to determine whether or not their products satisfy certain timing specifications. However, current approaches can involve elaborate preparation and provide only an approximation of the actual timing. For example, a System-on-Chip (SOC) product can include a processor subsystem and a programmable logic subsystem having the processor subsystem and the programmable logic subsystem coupled to I/O pads of the SOC via a switch. Testing the delay on the I/O paths from the processor subsystem to the I/O pads can involve creating test programs that execute on the processor subsystem and that write data to and read data from various ones of the I/O pads of the SOC. However, execution of the test programs does not provide sufficient control to determine set-up and hold times for I/O pads on the receive interface of the processor subsystem or the clock-to-out minimum/maximum times to I/O pads from the transmit interface of the processor subsystem.

SUMMARY

A disclosed circuit arrangement includes a plurality of input-output pads, a plurality of receive flip-flops, and a plurality of transmit flip-flops coupled to the plurality of input-output pads. Data path control circuitry is coupled to a plurality of data path control flip-flops, the plurality of receive flip-flops and the plurality of transmit flip-flops. The data path control circuitry is configured to selectably couple the plurality of receive flip-flops and the plurality of transmit flip-flops to the plurality of input-output pads in response to states of the plurality of data path control flip-flops. Clock control circuitry is coupled to a plurality of clock control flip-flops, the plurality of receive flip-flops and the plurality of transmit flip-flops. The clock control circuitry is configured to selectably apply one of a plurality of clock signals to the plurality of receive flip-flops and the plurality of transmit flip-flops in response to states of the plurality of clock control flip-flops. A first scan chain is coupled to the clock control flip-flops and the data path control flip-flops. A second scan chain is coupled to the plurality of receive flip-flops and the plurality of transmit flip-flops.

Another circuit arrangement includes a plurality of input-output pads, a programmable logic subsystem including programmable logic circuitry, and a processor subsystem. The processor subsystem includes a processor communicatively coupled to the programmable logic circuitry. The processor sub-system further includes a plurality of receive flip-flops and a plurality of transmit flip-flops coupled to the processor and to the plurality of input-output pads. The processor subsystem also includes data path control circuitry coupled to a plurality of data path control flip-flops, the plurality of receive flip-flops and the plurality of transmit flip-flops. The data path control circuitry is configured to selectably couple the plurality of receive flip-flops and the plurality of transmit flip-flops to the plurality of input-output pads in response to states of the plurality of data path control flip-flops. The processor sub-system also includes clock control circuitry coupled to a plurality of clock control flip-flops, the plurality of receive flip-flops and the plurality of transmit flip-flops. The clock control circuitry is configured to selectably apply one of a plurality of clock signals to the plurality of receive flip-flops and the plurality of transmit flip-flops in response to states of the plurality of clock control flip-flops. A first scan chain coupled to the programmable logic circuitry, the clock control flip-flops, and the data path control flip-flops. A second scan chain is coupled to the plurality of receive flip-flops and the plurality of transmit flip-flops.

A disclosed method of testing a circuit includes scanning-in first scan data to a first scan chain that includes a plurality of data path control flip-flops and a plurality of clock control flip-flops, and scanning-in second scan data to a second scan chain that includes a plurality of receive flip-flops and a plurality of transmit flip-flops. In response to states of the plurality of data path control flip-flops, one of the plurality of receive flip-flops or one of the plurality of transmit flip-flops is coupled to one of a plurality of input-output pads. The method activates a test of a delay between the one of the plurality of receive flip-flops or one of the plurality of transmit flip-flops and the one of a plurality of input-output pads by selecting, in response to states of the plurality of clock control flip-flops, one functional clock signal of a plurality of clock signals, and applying pulses of the selected functional clock signal to the one of the plurality of receive flip-flops or one of the plurality of transmit flip-flops. Third data can be either measured on the input-output pads (for transmit paths from transmit flip-flops to the input-output pads) or scanned-out from the plurality of receive flip-flops (for receive paths from input-output pads to receive flip-flops).

Other features will be recognized from consideration of the Detailed Description and Claims, which follow.

BRIEF DESCRIPTION OF THE DRAWINGS

Various aspects and features of the disclosed method and system will become apparent upon review of the following detailed description and upon reference to the drawings in which.

DETAILED DESCRIPTION

Figure 1:
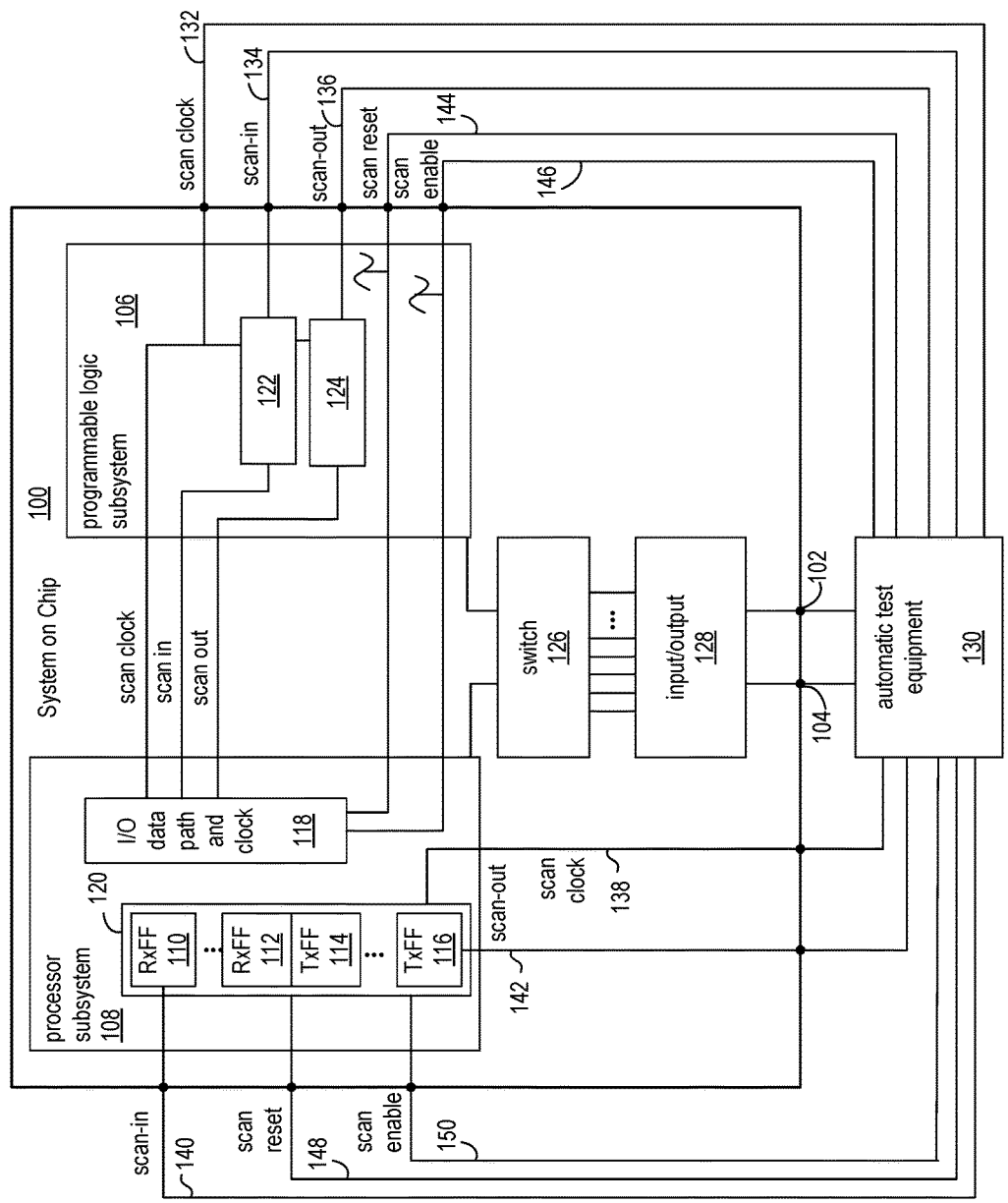
FIG. 1 shows an exemplary System-on-Chip in which one scan chain is used to operate on the receive and transmit flip-flops and another scan chain is used to control data path and clock options for the I/O paths.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Multiple scan chains are employed in the disclosed circuitry in order to separate configuration of the clock control and data path control from the transmit and receive flip-flops that are connected to the I/O pads while running I/O path delay tests. Data path control flip-flops and clock control flip-flops are connected in a first scan chain, and the receive flip-flops and transmit flip-flops are connected in a second scan chain. Data path control circuitry, in response to the states of the data path control flip-flops, selectively couples one or more of the receive flip-flops to one of more of the I/O pads and selectively couples one or more of the transmit flip-flops to one or more of the I/O pads. Clock control circuitry, in response to states of the plurality of clock control flip-flops, selectively couples one of multiple clock signals to the receive flip-flops and the transmit flip-flops. During a test set-up phase, the data path control flip-flops and clock control flip-flops are configured through the first scan chain, and the receive flip-flops and transmit flip-flops are configured through the second scan chain. While executing tests, such as to determine set-up and hold times for I/O pads on a receive interface or the clock-to-out minimum/maximum times to I/O pads from a transmit interface, the states of the data path control flip-flops and clock control flip-flops are undisturbed, and the receive flip-flops and transmit flip-flops can be accessed through the separate scan chain to access states and compute timing values.

Figure 6:
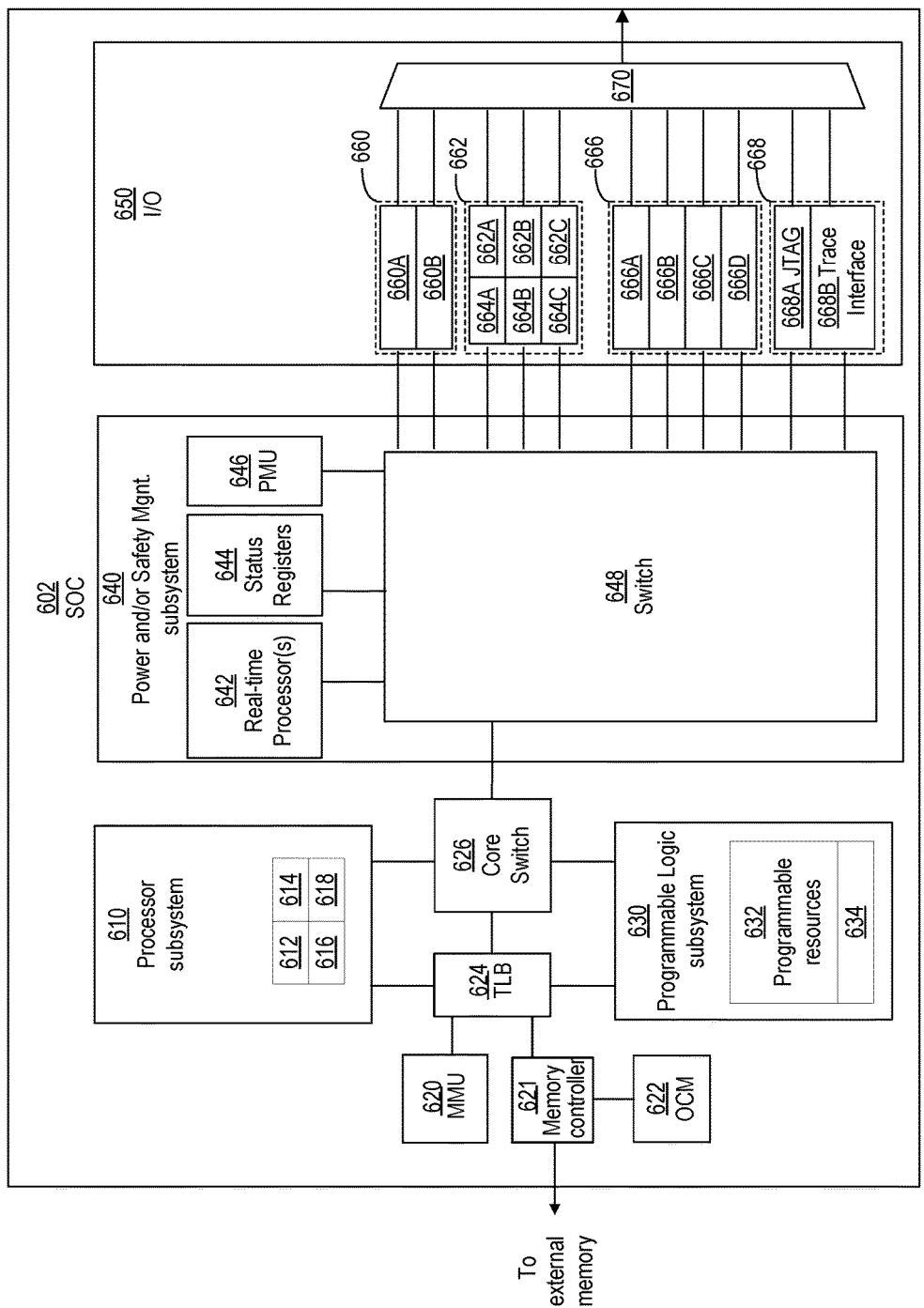
FIG. 6 shows an example programmable IC that may be configured in accordance with one or more implementations.

FIG. 1 shows an exemplary System-on-Chip (SOC) in which one scan chain is used to operate on the receive and transmit flip-flops and another scan chain is used to control data path and clock options for the I/O paths. The SOC 100 includes a programmable logic subsystem 106 and a processor subsystem 108. The programmable logic subsystem can include programmable logic resources, programmable routing resources, and programmable clock resources. The processor subsystem can include multiple general purpose or special purpose processor cores as shown in FIG. 6, and the processor cores are coupled to the I/O pads 102 and 104 via receive flip-flops 110-112, transmit flip-flops 114-116, switch 126, and I/O module 128. The programmable logic subsystem is also coupled to the I/O pads via switch 126 and I/O module 128.

The data path control circuitry and clock control circuitry are coupled in a first scan chain, which is illustrated as blocks 122, 118, and 124, and the receive flip-flops 110-112 and transmit flip-flops 114-116 are coupled in a second scan chain, which is illustrated as block 120. The automated test equipment (ATE) 130 is coupled to the first and second scan chains via separate channels. At a first scan port of the SOC, the ATE provides the scan clock signal 132, scan reset signal 144, scan enable signal 146 and scan-in data 134 to the first scan chain at block 122, and receives scan-out data 136 from block 124. The scan reset signal 144 and scan enable signal 146 are connected to scan chain blocks 122 and 124, though the connection lines are omitted in order to avoid obscuring the drawing. At a second scan port of the SOC, the ATE 130 provides another scan clock signal 138, scan reset signal 148, scan enable signal 150, and scan-in data 140 to the scan chain 120, and receives scan-out data 142 from the scan chain 120. The scan clock signal 132, scan reset signal 144, and scan enable signal 146 are connected to block 118 of the scan chain through the programmable logic subsystem.

Figure 2:
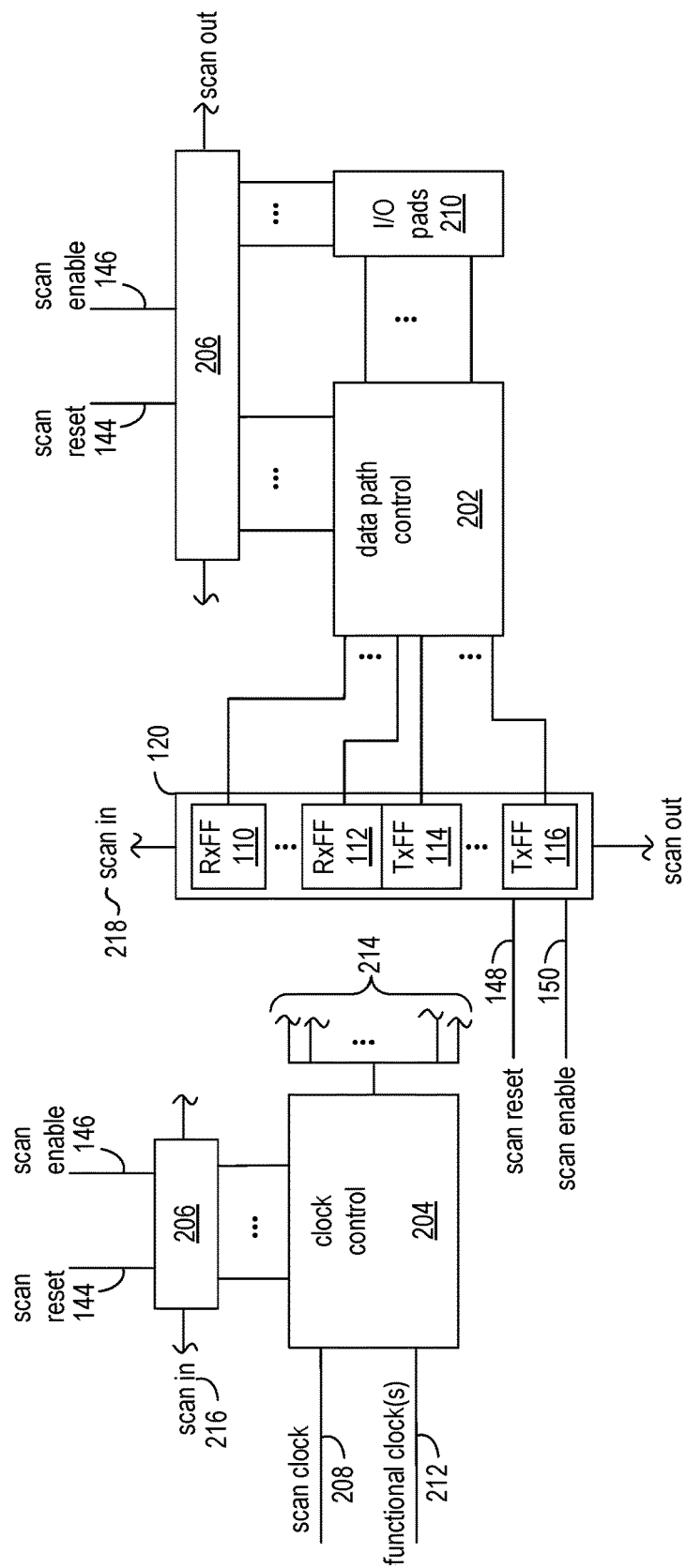
FIG. 2 shows the data path control circuitry and clock control circuitry, the scan chain that controls the data path control circuitry and clock control circuitry, and the scan chain that includes the receive and transmit flip-flops.

The scan chain of block 118 is used by data path control circuitry and clock control circuitry (FIG. 2). The data path control circuitry selectably couples one or more of the receive flip-flops 110-112 and/or one or more of the transmit flip-flops 114-116 to the I/O pads 102, 104 in response to states of data path control flip-flops in the scan chain 118. The clock control circuitry selectably applies one of multiple clock signals to the receive flip-flops and the transmit flip-flops in response to states of clock control flip-flops in the scan chain 118.

The scan chain 120 scans-in data to one or more of the transmit flip-flops 114-116 for output to one or more of the I/O pads 102, 104 and scans-out data from one or more of the receive flip-flops 110-112 for data received from one or more of the I/O pads 102, 104. Additional flip-flops (FIG. 4) of the scan chain 120 are also used to control the propagation of functional clock pulses while characterizing an I/O path.

FIG. 1 shows a particular implementation of two independent scan chains in an SOC. Other implementations may be directed to ASICs without a programmable logic subsystem, concatenated scan chains, concatenated scan chains having access through multiple pads of the die, so that when one set of pads are characterized for interface timing the scan chains can be accessed through different set of I/O pads, a single scan chain having only the receive and transmit flip-flops. The various alternative implementations provide access to the receive and transmit flip-flops through a scan chain for loading values, and allow characterization of the receive and transmit flip-flops to I/O pads path during I/O scan test capture.

FIG. 2 shows the data path control circuitry and clock control circuitry, the scan chain that controls the data path control circuitry and clock control circuitry, and the scan chain that includes the receive and transmit flip-flops. Scan chain 206 controls the data path control circuitry 202, I/O pads 210, and clock control circuitry 204. Scan chain 120 includes the receive flip-flops 110-112 and the transmit flip-flops 114-116.

The data path control circuitry 202 is coupled to the scan chain 206, receive flip-flops 110-112, transmit flip-flops 114-116, and I/O pads 210. The data path control circuitry couples selected ones of the receive flip-flops and/or transmit flip-flops to ones of the I/O pads based on the states of the flip-flops in the scan chain 206. The states of the flip-flops on the scan chain 206 are dependent on which I/O path(s) is to be tested. One or more of the receive flip-flops can be coupled to respective ones of the I/O pads for a test, one or more of the transmit flip-flops can be coupled to respective ones of the I/O pads for a test, or a combination of one or more receive flip-flops and one or more transmit flip-flops can be coupled to respective ones of the I/O pads for a test.

The clock control circuitry 204 is coupled to the scan chain 206, receive flip-flops 110-112, transmit flip-flops 114-116, and I/O pads 210. Based on the states of the flip-flops in scan chain 206, the clock control circuitry selects one clock signal from the scan clock signal 208 and one or more functional clock signals 212. The selected clock signal is distributed to the receive flip-flops, transmit flip-flops, and I/O pads via signal lines 214.

Scan chain 120 is separate from scan chain 206. That is, the flip-flops of scan chain 206 are not connected to the receive flip-flops 110-112 and transmit flip-flops 114-116 of scan chain 120. The receive flip-flops and transmit flip-flops cannot receive scan-in data 216, and the flip-flops in scan chain 206 cannot receive scan-in data 218.

Figure 3:
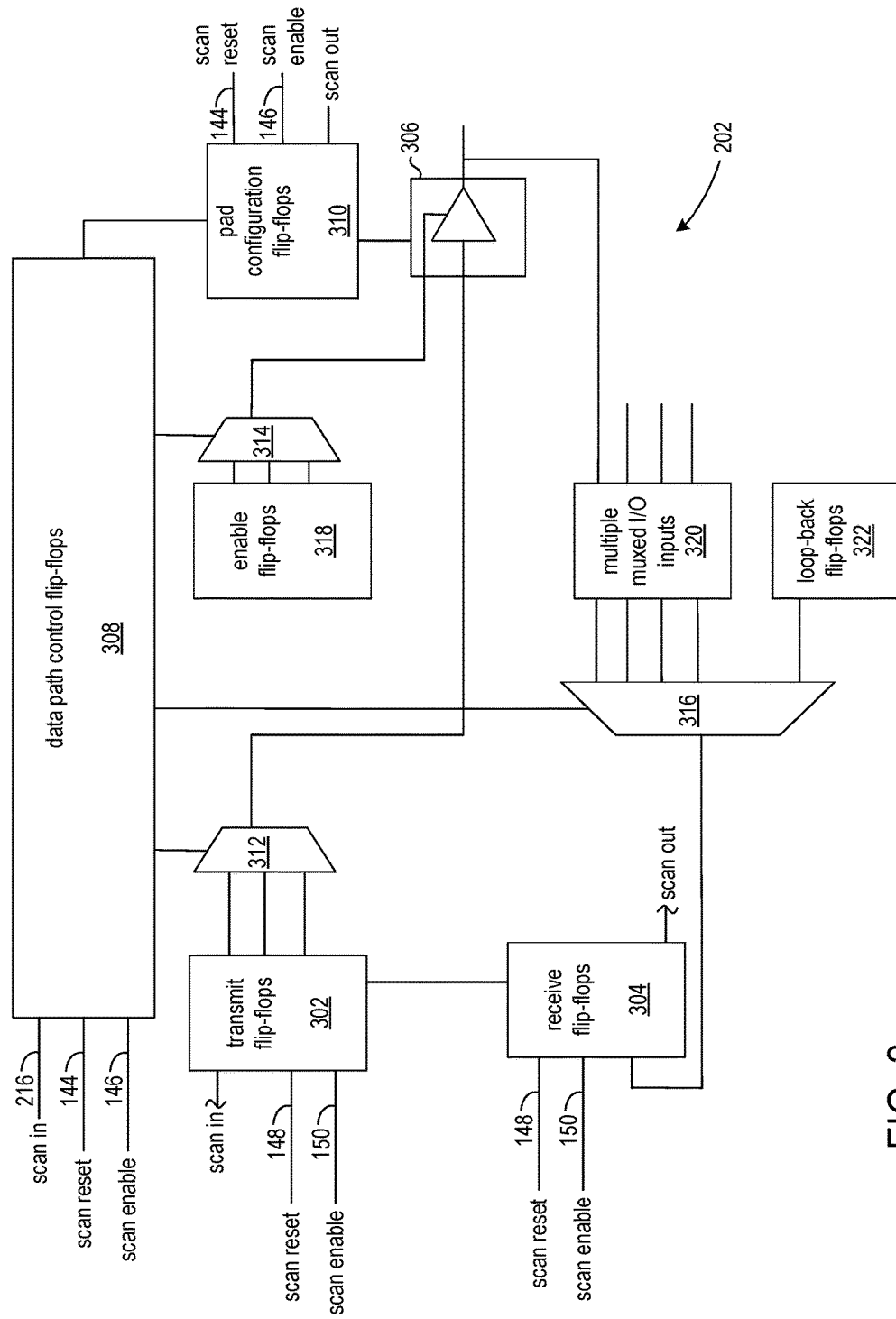
FIG. 3 shows the data path control circuit, along with transmit flip-flops, receive flip-flops, an exemplary I/O pad, and the data path control flip-flops and pad configuration flip-flops of the scan chain.

FIG. 3 shows the data path control circuit 202, along with transmit flip-flops 302, receive flip-flops 304, an exemplary I/O pad 306, and data path control flip-flops 308 and pad configuration flip-flops 310 of the scan chain 206. The states of the data path control flip-flops control the multiplexers 312, 314, and 316. As the I/O pad 306 can be shared among multiple peripherals (for example, USB, QSPI, etc.), each peripheral has receive, transmit and enable flip-flops that control the I/O pad directly when the I/O pad is being characterized for that peripheral. Multiplexer 312 selects the output signal from one of the transmit flip-flops 302 for driving the I/O pad 314. Multiplexer 314 selects the output signal from one of the enable flip-flops 318 in order to enable the I/O pad 306. Multiplexer 316 selects a signal from multiple multiplexed I/O inputs 320 or loop-back flip-flops 322 for input to one of the receive flip-flops 304. The states of the pad configuration flip-flops control the drive strength, slew rate, and/or reference voltage of I/O pad 306 and other I/O pads of the IC.

Figure 4:
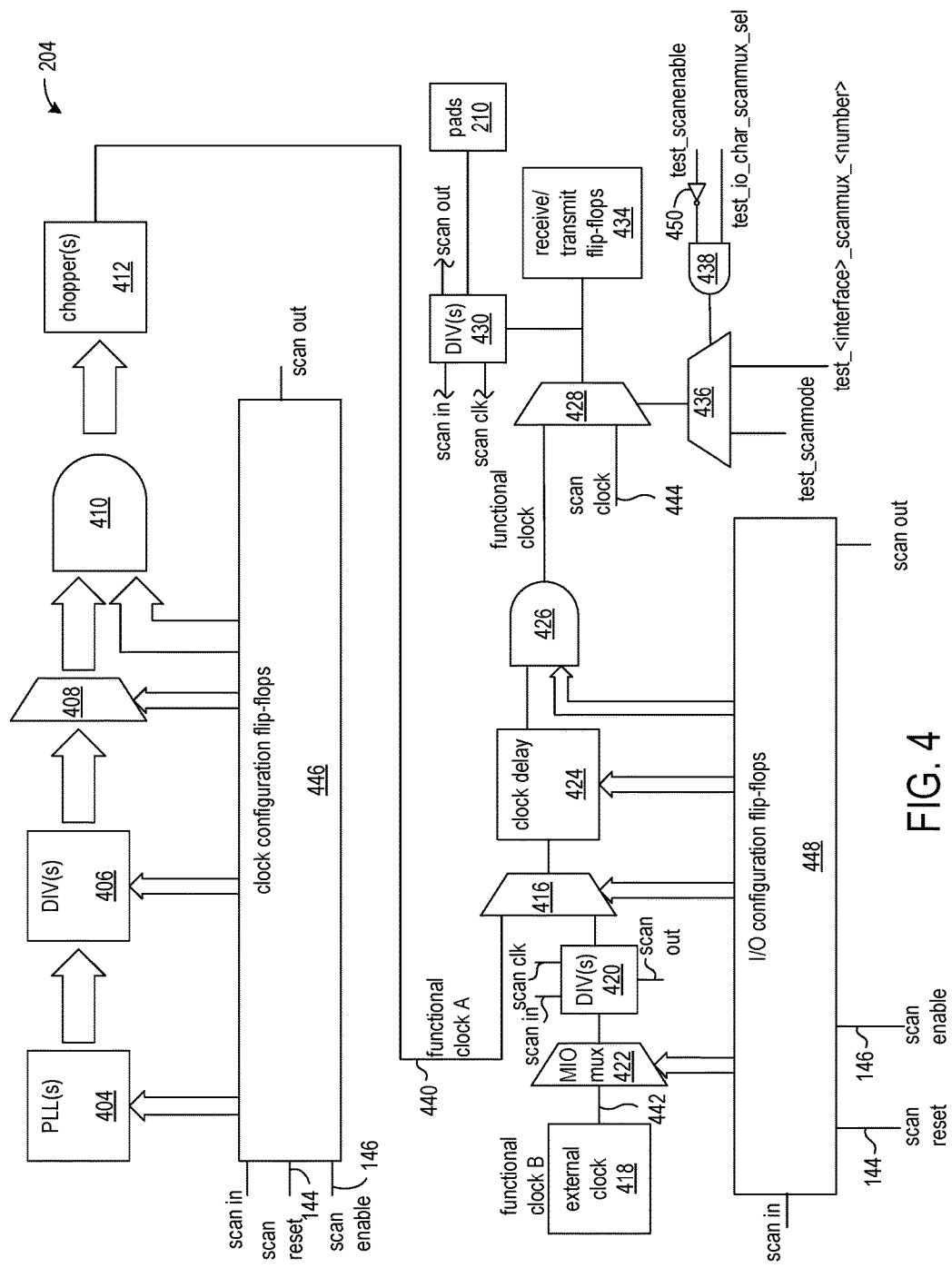
FIG. 4 shows clock control circuitry and the associated clock configuration flip-flops and I/O configuration flip-flops of the scan chain for controlling the clock control circuitry.

FIG. 4 shows clock control circuitry 204 and the associated clock configuration flip-flops 446 and I/O configuration flip-flops 448 of the scan chain 206 for controlling the clock control circuitry. Generally, the clock control circuitry selects either a scan clock signal or a functional clock signal for application to the receive and transmit flip-flops 434 and I/O pads 210. The clock control circuitry also generates a desired number pulses of a functional clock. The clock configuration flip-flops 446, which can be part of a scan chain that is separate from scan chains 120 and 206, enable functional clock propagation, and the I/O configuration flip-flops 448 select and enable either a scan clock signal or a functional clock signal.

A clock reset section of the clock control circuitry includes multiple phase-locked loop circuits (PLLs) 404, clock divider circuits 406, multiplexers 408, AND gates 410, and chopper circuits 412. The output from each chopper circuit 412 is a desired number of pulses of a functional clock signal. The AND gate(s) 410 is a functional clock gate used to disable/enable a functional clock for meeting the power requirements of the design. For testing, the clock(s) is enabled through the AND gate by programming clock configuration flip-flops 446. In one implementation, the chopper circuit(s) can have chopper configuration flip-flops, which are part of the scan chain having clock configuration flip-flops 446 and are available to automatic test pattern generation (ATPG) in all modes of scan testing for enabling and disabling any functional clock signal during scan testing.

The clock reset section has a combination of clock multiplexer logic 408 and clock divider circuitry 406. Each functional clock signal that is generated goes through stages of dividers 406 and multiplexers 408, and each functional clock signal output from the clock reset section is output by a chopper. Generally, each functional clock signal output by one of the choppers 412 is asynchronous to other clock signals output by others of the choppers. Clock signals that are synchronous will have clock frequencies that are a ratio (e.g., 1X, 2X, 4X, 0.5X etc.). Different clock signals can be routed (not shown) to parts of a circuit that are in different clock domains.

A clock selection section of the clock control circuitry includes circuitry for selecting one of multiple clock signals to drive the receive and transmit flip-flops 434 and optionally I/O pads 210. Generally, the clock selection section selects between an internally-generated functional clock signal A 440 from chopper circuit 412, an externally generated functional clock signal B 442 from external clock source 418, or a scan clock signal 444. Multiplexer 416 selects between functional clock signal A 440 and functional clock signal B 440 based on the states of the I/O configuration flip-flops 448, and multiplexer 428 selects between the selected functional clock signal and the scan clock signal 444.

Multiplexer 422 selects from multiple external clock sources in response to states of the I/O configuration flip-flops 448. An external clock signal may be useful in situations in which an I/O interface allows the interface clock to be driven by either an external clock signal that is provided from the board or by a functional, on-chip clock. In some instances, the on-chip functional clock signal may be unsuitable for characterization because of the uncertainty of functional clock behavior for the same time on different chips. An external clock signal can instead be used for characterization, as its behavior is the same for the same time across different chips. The external clock signal is driven from pads of the chip and controlled by ATE during I/O scan testing.

The external clock signals can be divided by divider circuits 420. The divider circuits are connected in the scan chain 120, which includes the receive and transmit flip-flops 434. The divider circuits can be constrained appropriately during testing by the states of the flip-flops in the scan chain 120 to achieve a desired toggle activity on a clock path relative to the data path. The clock delay circuit 424 can be activated by the I/O configuration flip-flops 448 to correct for clock skew. AND gate 426 may optionally serve as a clock gate to control the functional clock signal during scan testing mode.

The clock signal selected by multiplexer 428 can be divided by divider circuits 430 and used to drive the I/O pads 210. The divider circuits 430 are connected in the scan chain 120, which includes the receive and transmit flip-flops 434. The divider circuits can be constrained appropriately during testing by the states of the flip-flops in the scan chain 120 to achieve a desired toggle activity on a clock path relative to the data path.

The selection of either the functional clock signal or the scan clock signal by multiplexer 428 is controlled by the circuitry that includes multiplexer 436, AND gate 438, and inverter 450. Multiplexer 436 selects between a test_scanmode signal and a test<interface>_scanmux_<number> signal for controlling the multiplexer 428. The test_scanmode signal is a control signal that determines if the chip is in scan testing mode or functional mode. The test_scanmode signal is logic high during ATPG operations and during I/O scan testing, and is logic low during functional/mission mode operation of the target device. The test_scanmode signal can be used at many places as a control signal for scan testing.

The test_scanenable signal is used to select between functional Data (D pin of a flop) and scan data (SI pin of a flop), with the select being scan enable (SE)/test_scanenable. The test_scanenable signal is routed to all scan flip-flops in a circuit. When test_scanmode is logic high and test_scanenable is logic low the flip-flop captures the functional data (scan capture), and when test_scanmode is logic high and test_scanenable is logic high the flip-flop captures the scan shift data (scan shift). When test_scanmode is logic low and test_scanenable is X (don't care) the chip is in functional mode/mission mode of operation. The test_scanenable signal can be used in other scan structures such as on-chip clock controller/chopper, I/O pad direction control, and I/O scan testing clock selection etc. Table 1 shows the design states for combinations of states of the test_scanmode and test_scanenable signals.

TABLE 1

| test_scanmode | test_scanenable | Design state |
| --- | --- | --- |
| 1 | 0 | Scan capture (at-speed/stuck at) |
| 1 | 1 | Scan shift |
| 0 | X | Mission mode/Functional mode of operation. |

The test_io_char_scanmux_sel signal is a control signal driven from test data registers of a test access port. The test_io_char_scanmux_sel signal is logic high during I/O Scan testing and logic low during any other modes. The test_io_char_scanmux_sel signal is used to override the test_scanmode signal on scan clock multiplexers to enable propagation of the functional clock/interface clock signal during capture in I/O Scan testing. Table 2 shows the design states for combinations states of the test_scanmode signal and the test_io_char_scanmux_sel signal.

TABLE 2

| test_scanmode | test_io_char_scanmux_sel | Design state |
| --- | --- | --- |
| 1 | 0 | Regular ATPG |
| 1 | 1 | I/O Scan testing for interface characterization |
| 0 | X | Mission mode/Functional mode of operation. |

The test_<interface>_scanmux_<number> signal is used to override test_scanmode when I/O scan testing is enabled so that the slow speed scan clock signal can be propagated for scan shift and the functional clock signal can be propagated for capture, as the functional clock signal will be used for characterization of timing of interfaces while in I/O scan testing mode. The <interface> refers to the interface under characterization for which design changes are made, such as USB, GEM, NAND, etc. The <number> refers to a numbered instance of the interface in a design in which there are multiple instances of an interface. The test_scanmode, test_io_char_scanmux_sel and test_<interface>_scanmux>_<number> signals are static signals during I/O scan testing and can be driven by test data registers of a test access port controller or from programmable logic of the programmable logic subsystem. Table 3 shows the design states for combinations of states of the test_scanmode, test_io_char_scanmux_sel and test_<interface>_scanmux>_<number> signals.

TABLE 3

| test_scanmode | test_io_char_scanmux_sel | test_<interface>_scanmux_<number> | Design state |
| --- | --- | --- | --- |
| 0 | X | X | Functional/Mission mode of operation. |
| 1 | 1 | 0 | I/O Scan testing. |
| 1 | 1 | 1 | I/O Scan testing. |
| 1 | 0 | X | Regular ATPG. I/O Scan testing is disabled. |

Figure 5:
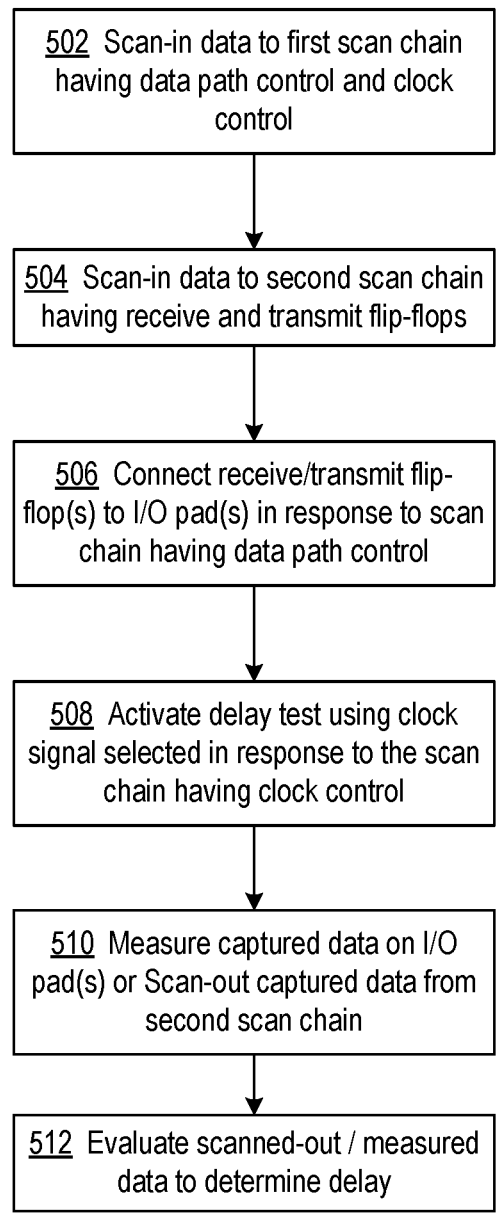
FIG. 5 is a flowchart of a process for testing the delay of a path between a receive/transmit flip-flop and an I/O pad on an integrated circuit die.

FIG. 5 is a flowchart of a process for testing the delay of a path between a receive/transmit flip-flop and an I/O pad on an integrated circuit die. At block 502, a first data set is scanned-in to the scan chain(s) that include flip-flops that control data path control circuitry and clock control circuitry that are used during an I/O scan test to characterize the timing of an I/O path between receive/transmit registers and I/O pads of the die. The scan chain(s) can include the data path control flip-flops 308, pad configuration flip-flops 310, clock configuration flip-flops 446, and the I/O configuration flip-flops 448 of FIGS. 3 and 4. The first data set includes data that control which clock signal is selected, a number of pulses of the selected clock signal, which receive flip-flop(s) and/or transmit flip-flop(s) are coupled to which I/O pad(s), and configuration of the I/O pad(s).

At block 504, a second data set is scanned-in to the scan chain 120 having the receive flip-flops 110-112 and the transmit flip-flops 114-116 (FIG. 1). The second data set can include particular values for the receive flip-flop(s) and/or transmit flip-flop(s) so that the ATE can determine whether or not the receive flip-flop(s) captured an input data signal and/or I/O pad received a data signal from the transmit flip-flop(s) using pulses of the selected clock signal during an I/O scan test. When the second data set is scanned in, tested and scanned out, the states of the first scan chain flip-flops are preserved and not disturbed as the states of the flip-flops in the first scan chain control running of the tests. The states can be preserved by holding the state of the scan clock signal and scan reset signal of the first scan chain in an off-state.

The configuration of the scan chain results in connection of one or more of the receive and/or transmit flip-flops to one or more of the I/O pads, respectively, at block 506. At block 508, the ATE activates the I/O scan test using one or more pulses of the selected clock signal. Different numbers of pulses may be used to sensitize the paths from the I/O pads to the receive flip-flops and from the transmit flip-flops to the I/O pads. The delay from a transmit flip-flop to an I/O pad can be measured by pulsing the launch clock signal and monitoring the data signal and clock signal at the I/O pad.

At block 510, depending on the test performed, the ATE either measures the captured data on pads relative to the launch/capture clock at the input/output pad(s) for transmit paths, or scans-out data from the scan chain for receive paths to measure timing of data relative to the launch/capture clock at the input/output pad(s). At block 512, the ATE evaluates the scanned-out or measured data depending on the test. The ATE evaluates the scanned-out data to determine the delay from an I/O pad to a received flip-flop. From the data scanned-out from the receive flip-flops and executing multiple I/O scan tests at different functional clock frequencies, the ATE can determine whether or not the I/O scan test satisfied setup and hold time requirements for different clock frequencies. Based on the data captured at the I/O pad(s) from a transmit flip-flop(s) in executing multiple I/O scan tests at different functional clock frequencies, the ATE can determine the maximum clock to output delay and the minimum clock to output delay. The timing of the launch data at the I/O pads is controlled by the ATE. The above measurement of data timing like setup, hold, clk to out min and max is always with respect to the clock signal at the input/output pads, which can be input (launch clock) or output (capture clock).

FIG. 6 shows an exemplary programmable IC 602 that can be configured in accordance with the disclosed scan test circuitry. The programmable IC may also be referred to as a System On Chip (SOC), which includes a processor subsystem 610 and a programmable logic subsystem 630. The processor subsystem 610 may be programmed to implement a software portion of the user design, via execution of a user program. The program may be specified as part of a configuration data stream or may be retrieved from an on-chip or off-chip data storage device. The processor subsystem 610 may include various circuits 612, 614, 616, and 618 for executing one or more software programs. The circuits 612, 614, 616, and 618 may include, for example, one or more processor cores, floating point units (FPUs), an interrupt processing unit, on chip-memory, memory caches, and/or cache coherent interconnect.

The programmable logic subsystem 630 of the programmable IC 602 may be programmed to implement a hardware portion of a user design. For instance, the programmable logic subsystem may include a number of programmable resources 632, which may be programmed to implement a set of circuits specified in a configuration data stream. The programmable resources 632 include, for example, programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 632 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 632. The configuration data can be read from memory (e.g., from an external PROM) or written into the programmable IC 602 by an external device. In some implementations, a configuration controller 634 included in the programmable logic subsystem 630 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 610.

The programmable IC 602 may include various circuits to interconnect the processor subsystem 610 with circuitry implemented within the programmable logic subsystem 630. In this example, the programmable IC 602 includes a core switch 626 that can route data signals between various data ports of the processor subsystem 610 and the programmable logic subsystem 630. The core switch 626 may also route data signals between either of the programmable logic or processing subsystems 610 and 630 and various other circuits of the programmable IC, such as an internal data bus. Alternatively or additionally, the processor subsystem 610 may include an interface to directly connect with the programmable logic subsystem—bypassing the core switch 626. Such an interface may be implemented, for example, using the AMBA AXI Protocol Specification (AXI) as published by ARM.

In some implementations, the processor subsystem 610 and the programmable logic subsystem 630 may also read or write to memory locations of an on-chip memory 622 or off-chip memory (not shown) via memory controller 621.

The memory controller 621 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 621 is able to communicate is provided for purposes of illustration only and is not intended as a limitation or to be exhaustive. As shown in FIG. 6, the programmable IC 602 may include a memory management unit 620 and translation look-aside buffer 624 to translate virtual memory addresses used by the subsystems 610 and 630 to physical memory addresses used by the memory controller 621 to access specific memory locations.

The programmable IC may include an input/output (I/O) subsystem 650 for communication of data with external circuits. The I/O subsystem 650 may include various types of I/O devices or interfaces including for example, flash memory type I/O devices, higher performance I/O devices, lower performance interfaces, debugging I/O devices, and/or RAM I/O devices.

The I/O subsystem 650 may include one or more flash memory interfaces 660 illustrated as 660A and 660B. For example, one or more of flash memory interfaces 660 can be implemented as a Quad-Serial Peripheral Interface (QSPI) configured for 4-bit communication. One or more of flash memory interfaces 660 can be implemented as a parallel 8-bit NOR/SRAM type of interface. One or more of flash memory interfaces 660 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 650 can include one or more interfaces 662 providing a higher level of performance than flash memory interfaces 660. Each of interfaces 662A-662C can be coupled to a DMA controller 664A-664C respectively. For example, one or more of interfaces 662 can be implemented as a Universal Serial Bus (USB) type of interface. One or more of interfaces 662 can be implemented as a gigabit Ethernet type of interface. One or more of interfaces 662 can be implemented as a Secure Digital (SD) type of interface.

The I/O subsystem 650 may also include one or more interfaces 666 such as interfaces 666A-666D that provide a lower level of performance than interfaces 662. For example, one or more of interfaces 666 can be implemented as a General Purpose I/O (GPIO) type of interface. One or more of interfaces 666 can be implemented as a Universal Asynchronous Receiver/Transmitter (UART) type of interface. One or more of interfaces 666 can be implemented in the form of a Serial Peripheral Interface (SPI) bus type of interface. One or more of interfaces 666 can be implemented in the form of a Controller-Area-Network (CAN) type of interface and/or an $I^2C$ type of interface. One or more of interfaces 666 also can be implemented in the form of a timer type of interface.

The I/O subsystem 650 can include one or more debug interfaces 668 such as processor JTAG (PJTAG) interface 668A and a trace interface 668B. PJTAG interface 668A can provide an external debug interface for the programmable IC 602. Trace interface 668B can provide a port to receive debug, e.g., trace, information from the processor subsystem 610 or the programmable logic subsystem 630.

As shown, each of interfaces 660, 662, 666, and 668 can be coupled to a multiplexer 670. Multiplexer 670 provides a plurality of outputs that can be directly routed or coupled to external pins of the programmable IC 602, e.g., balls of the package within which the programmable IC 602 is disposed. For example, I/O pins of programmable IC 602 can be shared among interfaces 660, 662, 666, and 668. A user can configure multiplexer 670, via a configuration data stream to select which of interfaces 660-668 are to be used and, therefore, coupled to I/O pins of programmable IC 602 via multiplexer 670. The I/O subsystem 650, may also include a fabric multiplexer I/O (FMIO) interface (not shown) to connect interfaces 662-668 to programmable logic circuits of the programmable logic subsystem. Additionally or alternatively, the programmable logic subsystem 630 can be configured to implement one or more I/O circuits within programmable logic. In some implementations, the programmable IC 602 may also include a subsystem 640 having various circuits for power and/or safety management. For example, the subsystem 640 may include a power management unit 646 configured to monitor and maintain one or more voltage domains used to power the various subsystems of the programmable IC 602. In some implementations, the power management unit 646 may disable power of individual subsystems, when idle, to reduce power consumption, without disabling power to subsystems in use.

The subsystem 640 may also include safety circuits to monitor the status of the subsystems to ensure correct operation. For instance, the subsystem 640 may include one or more real-time processors 642 configured to monitor the status of the various subsystems (e.g., as indicated in status registers 644). The real-time processors 642 may be configured to perform a number of tasks in response to detecting errors. For example, for some errors, the real-time processors 642 may generate an alert in response to detecting an error. As another example, the real-time processors 642 may reset a subsystem to attempt to restore the subsystem to correct operation. The subsystem 640 includes a switch network 648 that may be used to interconnect various subsystems. For example, the switch network 648 may be configured to connect the various subsystems 610, 630, and 640 to various interfaces of the I/O subsystem 650. In some applications, the switch network 648 may also be used to isolate the real-time processors 642 from the subsystems that are to be monitored. Such isolation may be required by certain application standards (e.g., IEC-61508 SIL3 or ISO-26262 standards) to ensure that the real-time processors 642 are not affected by errors that occur in other subsystems.

Though aspects and features may in some cases be described in individual figures, it will be appreciated that features from one figure can be combined with features of another figure even though the combination is not explicitly shown or explicitly described as a combination.

The circuitry and methods are thought to be applicable to a variety of systems for testing I/O path delay. Other aspects and features will be apparent to those skilled in the art from consideration of the specification. It is intended that the specification and drawings be considered as examples only, with a true scope of the invention being indicated by the following claims.

What is claimed is:

1. A circuit arrangement comprising:
   a plurality of input-output pads;
   a plurality of receive flip-flops and a plurality of transmit flip-flops coupled to the plurality of input-output pads;
   a plurality of data path control flip-flops;
   data path control circuitry coupled to the plurality of data path control flip-flops, the plurality of receive flip-flops and the plurality of transmit flip-flops, the data path control circuitry configured to selectably couple the plurality of receive flip-flops and the plurality of transmit flip-flops to the plurality of input-output pads in response to states of the plurality of data path control flip-flops;
   a plurality of clock control flip-flops;
   clock control circuitry coupled to the plurality of clock control flip-flops, the plurality of receive flip-flops and the plurality of transmit flip-flops, the clock control circuitry configured to selectably apply one of a plurality of clock signals to the plurality of receive flip-flops and the plurality of transmit flip-flops in response to states of the plurality of clock control flip-flops;
   a first scan chain coupled to the clock control flip-flops and the data path control flip-flops; and
   a second scan chain coupled to the plurality of receive flip-flops and the plurality of transmit flip-flops.

2. The circuit arrangement of claim 1, wherein the clock control circuitry is further configured to generate a specific number of pulses of one of the plurality of clock signals in response to states of the plurality of clock control flip-flops.

3. The circuit arrangement of claim 2, wherein the first scan chain is coupled to a first scan port that provides a first scan clock signal and input and output of first scan data, and the second scan chain is coupled to a second scan port that provides a second scan clock signal and input and output of second scan data.

4. The circuit arrangement of claim 1, wherein a first clock signal of the plurality of clock signals is an internal functional clock signal generated on an integrated circuit (IC) die on which the first and second scan chains are implemented, and a second clock signal of the plurality of clock signals is an external functional clock signal input to the IC die.

5. The circuit arrangement of claim 4, wherein a third clock signal of the plurality of clock signals is a scan clock signal input to the IC die.

6. The circuit arrangement of claim 1, further comprising a plurality of pad configuration flip-flops coupled to the plurality of input-output pads and to the first scan chain, wherein states of the plurality of pad configuration flip-flops control one or more of drive strength, slew rate, or reference voltage of the plurality of input-output pads.

7. The circuit arrangement of claim 1, wherein the first scan chain is coupled to a first scan port that provides a first scan clock signal and input and output of first scan data, and the second scan chain is coupled to a second scan port that provides a second scan clock signal and input and output of second scan data.

8. The circuit arrangement of claim 1, wherein the data path control circuitry is further configured to couple one input-output pad of the plurality of input-output pads to receive an output signal from one transmit flip-flop of the plurality of transmit flip-flops in response to a state of one data path control flip-flop of the plurality of data path control flip-flops.

9. The circuit arrangement of claim 1, wherein the data path control circuitry is further configured to couple one receive flip-flop of the plurality of receive flip-flops to input a signal from one input-output pad of the plurality of input-output pads in response to a state of one data path control flip-flop of the plurality of data path control flip-flops.

10. A circuit arrangement comprising:
    a plurality of input-output pads;
    a programmable logic subsystem including programmable logic circuitry;

a processor subsystem including:
   a processor communicatively coupled to the programmable logic circuitry;
   a plurality of receive flip-flops and a plurality of transmit flip-flops coupled to the processor and to the plurality of input-output pads;
   a plurality of data path control flip-flops;
   data path control circuitry coupled to the plurality of data path control flip-flops, the plurality of receive flip-flops and the plurality of transmit flip-flops, the data path control circuitry configured to selectably couple the plurality of receive flip-flops and the plurality of transmit flip-flops to the plurality of input-output pads in response to states of the plurality of data path control flip-flops;
   a plurality of clock control flip-flops; and
   clock control circuitry coupled to the plurality of clock control flip-flops, the plurality of receive flip-flops and the plurality of transmit flip-flops, the clock control circuitry configured to selectably apply one of a plurality of clock signals to the plurality of receive flip-flops and the plurality of transmit flip-flops in response to states of the plurality of clock control flip-flops;
a first scan chain coupled to the programmable logic circuitry, the clock control flip-flops, and the data path control flip-flops; and
a second scan chain coupled to the plurality of receive flip-flops and the plurality of transmit flip-flops.

11. The circuit arrangement of claim 10, wherein the clock control circuitry is further configured to generate a specific number of pulses of one of the plurality of clock signals in response to states of the plurality of clock control flip-flops.

12. The circuit arrangement of claim 11, wherein the first scan chain is coupled to a first scan port that provides a first scan clock signal and input and output of first scan data, and the second scan chain is coupled to a second scan port that provides a second scan clock signal and input and output of second scan data.

13. The circuit arrangement of claim 10, wherein a first clock signal of the plurality of clock signals is an internal functional clock signal generated within the processor subsystem and a second clock signal of the plurality of clock signals is an external functional clock signal input to the processor subsystem.

14. The circuit arrangement of claim 13, wherein a third clock signal of the plurality of clock signals is a scan clock signal input to the processor subsystem.

15. The circuit arrangement of claim 10, further comprising a plurality of pad configuration flip-flops coupled to the plurality of input-output pads and to the first scan chain, wherein states of the plurality of pad configuration flip-flops control one or more of drive strength, slew rate, or reference voltage of the plurality of input-output pads.

16. The circuit arrangement of claim 10, wherein the first scan chain is coupled to a first scan port that provides a first scan clock signal and input and output of first scan data, and the second scan chain is coupled to a second scan port that provides a second scan clock signal and input and output of second scan data.

17. The circuit arrangement of claim 10, wherein the data path control circuitry is further configured to couple one input-output pad of the plurality of input-output pads to receive an output signal from one transmit flip-flop of the plurality of transmit flip-flops in response to a state of one data path control flip-flop of the plurality of data path control flip-flops.

18. The circuit arrangement of claim 10, wherein the data path control circuitry is further configured to couple one receive flip-flop of the plurality of receive flip-flops to input a signal from one input-output pad of the plurality of input-output pads in response to a state of one data path control flip-flop of the plurality of data path control flip-flops.

19. The circuit arrangement of claim 10, wherein the programmable logic subsystem, processor subsystem, plurality of input-output pads, first scan chain, and second scan chain are implemented as a system-on-chip.

20. A method of testing a circuit, comprising:
   scanning-in first scan data to a first scan chain that includes a plurality of data path control flip-flops and a plurality of clock control flip-flops;
   scanning-in second scan data to a second scan chain that includes a plurality of receive flip-flops and a plurality of transmit flip-flops;
   coupling one of the plurality of receive flip-flops or one of the plurality of transmit flip-flops to one of a plurality of input-output pads in response to states of the plurality of data path control flip-flops;
   activating a test of a delay between the one of the plurality of receive flip-flops or one of the plurality of transmit flip-flops and the one of the plurality of input-output pads by selecting one functional clock signal of a plurality of clock signals in response to states of the plurality of clock control flip-flops, and applying pulses of the one functional clock signal to the one of the plurality of receive flip-flops or one of the plurality of transmit flip-flops; and
   scanning-out third data from the plurality of receive flip-flops and the plurality of transmit flip-flops.

* * * * *